(12) United States Patent
Guo et al.

(10) Patent No.: US 8,748,216 B2
(45) Date of Patent: Jun. 10, 2014

(54) NON-VACUUM METHOD FOR FABRICATION OF A PHOTOVOLTAIC ABSORBER LAYER

(75) Inventors: Wei Guo, Canton, MI (US); Yu Jin, Santa Clara, CA (US); Bing Liu, Ann Arbor, MI (US); Yong Che, Ann Arbor, MI (US); Kevin V. Hagedorn, Northville, MI (US)

(73) Assignee: IMRA America, Inc., Ann Arbor, MI (US)

( * ) Notice: Subject to any disclaimer, the term of this patent is extended or adjusted under 35 U.S.C. 154(b) by 56 days.

(21) Appl. No.: 13/198,744

(22) Filed: Aug. 5, 2011

(65) Prior Publication Data

US 2012/0098032 A1    Apr. 26, 2012

Related U.S. Application Data

(63) Continuation-in-part of application No. 12/910,929, filed on Oct. 25, 2010, now Pat. No. 8,409,906, and a continuation of application No. 13/053,441, filed on Mar. 22, 2011.

(51) Int. Cl.
*H01L 31/18* (2006.01)
*H01L 31/032* (2006.01)

(52) U.S. Cl.
USPC ............... 438/88; 257/E31.026; 257/E31.027

(58) Field of Classification Search
None
See application file for complete search history.

(56) References Cited

U.S. PATENT DOCUMENTS

| | | | |
|---|---|---|---|
| 3,879,276 A | 4/1975 | Underwood et al. | |
| 4,204,933 A | 5/1980 | Barlow et al. | |
| 4,225,408 A | 9/1980 | Barlow et al. | |
| 4,482,447 A | 11/1984 | Mizuguchi et al. | |
| 4,482,933 A | 11/1984 | Alexander | |
| 5,660,746 A | 8/1997 | Witanachchi | |
| 5,756,924 A | 5/1998 | Early | |
| 6,060,128 A | 5/2000 | Kim et al. | |
| 6,783,569 B2 | 8/2004 | Cheon et al. | |
| 7,235,736 B1 | 6/2007 | Buller et al. | |
| 7,306,823 B2 | 12/2007 | Sager et al. | |
| 7,604,843 B1 | 10/2009 | Robinson et al. | |
| 7,663,057 B2 | 2/2010 | Yu et al. | |
| 7,828,619 B1 * | 11/2010 | Yeh | 445/49 |
| 8,409,906 B2 * | 4/2013 | Guo et al. | 438/72 |
| 2005/0226287 A1 | 10/2005 | Shah et al. | |

(Continued)

FOREIGN PATENT DOCUMENTS

EP    0297799 A1    1/1989
WO    8810513 A1    12/1988

(Continued)

OTHER PUBLICATIONS

International Search Report; 3 Pages Dated Feb. 6, 2012.

(Continued)

*Primary Examiner* — Seahvosh Nikmanesh
(74) *Attorney, Agent, or Firm* — Dickinson Wright PLLC (57) ABSTRACT

The present invention provides a non-vacuum method of depositing a photovoltaic absorber layer based on electrophoretic deposition of a mixture of nanoparticles with a controlled atomic ratio between the elements. The nanoparticles are first dispersed in a liquid medium to form a colloidal suspension and then electrophoretically deposited onto a substrate to form a thin film photovoltaic absorber layer. The absorber layer may be subjected to optional post-deposition treatments for photovoltaic absorption.

9 Claims, 8 Drawing Sheets

(56) References Cited

U.S. PATENT DOCUMENTS

| | | | |
|---|---|---|---|
| 2005/0243396 A1 | 11/2005 | Fujii et al. | |
| 2005/0276931 A1 | 12/2005 | Che et al. | |
| 2006/0037641 A1 | 2/2006 | Kibbel et al. | |
| 2006/0086834 A1 | 4/2006 | Pfeffer et al. | |
| 2007/0029185 A1 | 2/2007 | Tung | |
| 2007/0051202 A1 | 3/2007 | Raghuraman et al. | |
| 2008/0041532 A1 | 2/2008 | Chou et al. | |
| 2009/0246413 A1 | 10/2009 | Murakami et al. | |
| 2009/0246530 A1 | 10/2009 | Murakami et al. | |
| 2009/0305455 A1 | 12/2009 | Leidholm et al. | |
| 2010/0133479 A1 | 6/2010 | Huang et al. | |
| 2010/0196192 A1 | 8/2010 | Liu et al. | |
| 2010/0242800 A1 | 9/2010 | Chuang | |
| 2010/0248419 A1 | 9/2010 | Woodruff et al. | |
| 2011/0192714 A1 | 8/2011 | Liu et al. | |
| 2012/0100660 A1* | 4/2012 | Hagedorn et al. | 438/63 |

FOREIGN PATENT DOCUMENTS

| | | | |
|---|---|---|---|
| WO | 2004019420 A1 | 3/2004 | |
| WO | 1529314 | 5/2005 | |
| WO | 2009117451 A1 | 9/2009 | |
| WO | 2010017124 A2 | 6/2010 | |

OTHER PUBLICATIONS

S. Ahn et al.: "Effects of Selenization Conditions on Densification of Cu(In,Ga)Se2 (CIGS) Thin Films Prepared by Spray Deposition of CIGS Nanoparticles" Journal of Applied Physics, 105113533 (2009).

S. Ahn et al.: "Nanoparticle derived Cu(In, Ga)Se2 Absorber Layer for Thin Film Solar Cells" Colloids and Surfaces, 313-314171 (2008).

Brown et al.: "The mechanism of electrophoretic deposition" J. Appl. Chem., 15, 40 (1965).

S. L. Castro et. al.: Nanocrystalline Chalcopyrite Materials (CuInS2 and CuInSe2) via Low-Temperature Pyrolysis of Molecular Single-Source Precursors, Chem. Mater. 15, 3142 (2003).

C. P. Chan et al.: " Preparation of Cu2ZnSnS4 film by Electrodeposition Using Ionic Liquids" Solar Energy Materials and Solar Cells, 94207 (2010).

M. Kaelin et al.: "CIS and CIGS Layers from Selenized Nanoparticle Precursors" Thin Solid Films, 431-43258 (2003).

V. K. Kapur et. al.: "Non-vacuum Processing of CuIn1-xGaxSe2 Solar Cells on Rigid and Flexible Substrates Using Nanoparticle Precursor Inks" Thin Solid Films, 431-253 (2003).

M. A. Malik et. al.: "A Novel Route for the Preparation of CuSe and CuInSe2 Nanoparticles" Adv. Mat. 11, 1441 (1999).

D. L. Schulz et al.: "Cu-In-Ga-Se Nanoparticle Colloids as a Spray Deposition Precursors for Cu(In,Ga)Se2 Solar Cell Materials," Journal of Electronic Materials, 27(5), 433 (1998).

Van der Biest et al: "Electrophoretic deposition of materials" Annu. Rev. Mater. Sci. 29, 327 (1999).

JJ. Zhu, "General Sonochemical Method for the Preparation of Nanophasic Selenides: Synthesis of ZnSe Nanoparticles" Chem. Mater., 12, 73, (2000).

International Preliminary Report On Patentability; Dated Apr. 30, 2013; 7 Pages.

Barcikowski et al., "Generation of nanoparticles colloids by picosecond and femtosecond laser ablation in liquid flow", Applied Physics Letters, vol. 91 (2007) 083113.

J. Brannon et al., "Laser Processing for Microengineering Applications", Chp 5 in Microengineering Aerospace Systems, editor: H. Helvajian, copyright 1999, pp. 145, 160-162, 187 and 188.

D. F. Huessy at al., "Water, Ultrapure" in Ullmann's Ency. Of Industrial Chemistry, Pub. Oct. 15, 2008, 26 pgs.

W. E. Nichols et al., "Laser Ablation of a platinum target in water. I. Ablations mechanisms", J of Applied Physics vol. 100, 2006, 114911.

A. Pyatenko et al., "Synthesis of silver nanoparticles by laser ablation in pure water", A. Pyatenko et al., Applied Physics A, vol. 79, 2004, pp. 803-806.

A.V. Simaken et al., "Nanodisks of Au and Ag produced by laser ablation in liquid environment", Chemical Physics Letters vol. 348, 2001, pp. 182-186.

Yang, Li, Chapter 2, "Liquid-Phase Pulsed Laser Ablation" in Self-assemble and Ordering Nanomaterials by Liquid-Phased Pulsed Laser Ablation, Dissertation, Nov. 2007 pp. 33-51.

* cited by examiner

NON-VACUUM METHOD FOR FABRICATION OF A PHOTOVOLTAIC ABSORBER LAYER

RELATED APPLICATIONS

The present application claims the benefit of U.S. application Ser. No. 12/910,929, filed on Oct. 25, 2010 now U.S. Pat. No. 8,409,906 as a continuation-in-part application and the benefit of U.S. application Ser. No. 13/053,441, filed on Mar. 22, 2011 as a continuation application. U.S. application Ser. No. 12/910,929 filed Oct. 25, 2010 and U.S. application Ser. No. 13/053,441 filed on Mar. 22, 2011 are hereby incorporated by reference in their entirety.

STATEMENT REGARDING FEDERALLY SPONSORED RESEARCH

NONE.

TECHNICAL FIELD

The present invention relates to fabrication of a photovoltaic absorber layer and a photovoltaic device incorporating the layer wherein the photovoltaic absorber layer is fabricated by electrophoretic deposition of nanoparticles of an absorptive material onto complexly shaped surfaces of fabricated items.

BACKGROUND OF THE INVENTION

Recent efforts for fabrication of photovoltaic devices have included developing cost-effective thin film solar cells with reasonable efficiencies as alternatives to traditional silicon-based solar cells. The core structure of such thin film solar cells typically contains a photovoltaic absorber layer of a chalcopyrite or a kesterite compound. An absorber layer made of a chalcopyrite compound typically contains elements from each of groups IB, IIIA, and VIA of the periodic table of elements, including copper and indium and/or gallium or aluminum and selenium and/or sulfur, denoted by Cu, In, Ga, Al, Se and S in commonly accepted chemical symbols. The chalcopyrite material $Cu(In,Ga)Se_2$ (CIGS), is a direct bandgap semiconductor that has demonstrated solar-to-electrical energy conversion efficiencies in excess of 20%. Remarkably, high efficiencies have been achieved using multi-crystalline materials and with stoichiometric compositions that vary by 5-10%; virtually all other semiconductor materials need to be single crystalline and defect-free to show any significant energy conversion efficiency. For such materials to perform as p-type solar absorbers and to have the desired carrier type and concentration, the atomic ratio between these group IB:IIIA:VIA elements, e.g., Cu:(In+Ga):Se is strictly controlled near 25%:25%:50% with allowable deviations towards Cu-deficient and Se-rich by percents of plus or minus 15%. This predetermined ratio is known to those of ordinary skill in the art and is adhered to in the design of these solar absorbers. Such absorber layers are often referred to as CIGS layers, and the corresponding devices are referred to as CIGS solar cells. The high tolerance of this CIGS material to varying material composition and defects is being leveraged to explore new low-cost methods for making large-area, low-cost photovoltaics. In particular, solution-based processes that involve spraying, printing or electrodeposition are currently being investigated, and some of these processes have achieved efficiencies above 10%. The realization of high-efficiency solar panels that can be deposited from solution would result in devices that can generate energy that are cost-competitive with fossil fuels. Alternatively, an absorber layer made of a kesterite compound typically contains elements from each of groups IB, IIB, IVA, and VIA of the periodic table of elements, e.g. copper and zinc and tin and selenium and/or sulfur, denoted by $Cu_2ZnSn(S,Se)_4$. Such absorber layers are often referred to as CZTS layers, and the corresponding devices are referred to as CZTS solar cells. These devices are attractive because they do not require the rare earth element indium. Kesterite materials have demonstrated efficiencies of 9.6% and may be an alternative to CIGS if indium is limiting. The atomic ratio between these group IB:(IIB+IVA):VIA elements, e.g. Cu:(Zn+Sn):(S+Se) is also strictly controlled near the predetermined ratio of 25%:25%:50%, with allowable deviations also towards slightly Cu-deficient and (S+Se)-rich by a few percents of plus or minus 15%.

Though the cost of solar panels is decreasing, installation costs still account for half of the cost of solar energy; this can be addressed by bundling solar cells with other consumer goods. In current manufacturing schemes for silicon-based photovoltaics, the processed and purified silicon compromises only 10% of the final cost of the cell, and manufacturing costs account for another 40%. The remainder of the cost is associated with module installation and other fixed costs such as inverter installation and connecting the cells to the grid. As the cost of solar cell modules continues to decrease, installation costs are poised to become greater than the module costs. Bundling solar cells with other consumer goods so that the energy generated by the solar cells can directly power the device rather than requiring that the cells first be connected to the electrical grid can offset the installation costs. One example could be the deposition of a photovoltaic paint on a car body, which would provide power to drive the car or charge the battery. Another example could be photovoltaic siding or roof tiles, the energy generated from which could be used for heating or cooling. For these applications, a method for depositing a conformal coating of the photovoltaic material on curved or complexly shaped surfaces is necessary. By complexly shaped surfaces in the present specification and claims it is meant that the object to be coated has a plurality of surfaces that are not all in the same plane. In typical solar panel construction the panels are flat, planar surfaces. In the present invention a complexly shaped surface is a non-planar surface meaning that the surface topography or surfaces of the object to be coated exist in at least two different planes, although a surface or a portion of it can be planar itself. Such shapes include, for example only and without limitation, cylinders, concave surfaces, convex surfaces, curvilinear surfaces, two surfaces that contact each other in a non-planar fashion and mixtures of these shapes.

Conventional vacuum-based techniques for depositing the absorber layer include evaporation, sputtering, chemical vapor deposition, and the like. The vacuum-based techniques provide for a well-controlled film composition and composition gradient and they yield absorber layers with high conversion efficiencies. These techniques, however, are of limited use because they require significant capital investment, involve complicated deposition procedures, and result in excessive waste of raw materials. In addition, vacuum-based techniques are not well matched to the large-scale and high-yield industrial manufacturing demand in the light of increasing solar cell panel size.

Generally, non-vacuum techniques are alternative techniques for depositing the absorber layer. These include electrodeposition, spray pyrolysis, paste coating, drop casting, screen printing, and the like. These techniques generally include a wet-process comprising providing a solution, suspension, ink, paste, or paint, which contains absorber precursor materials and may be rapidly coated into a thin layer on a substrate. The precursor layer is then heat-treated to form a polycrystalline absorber film by annealing and/or selenization or sulfurization in a reactive gas of ambient or evaporated selenium or sulfur vapor. The non-vacuum-based techniques are more favorable than the vacuum-based techniques because they provide high efficiencies in raw material utilization, fast and simple deposition procedures, low capital investment and processing costs, and possibilities for manufacturing scale-up. In addition, flexible substrates may be incorporated into these techniques.

One of the most important parameters in fabrication of high quality solar absorber layers is precise control of the chemical composition of the absorber layer, which is critical for providing the absorber layer with a desired crystal structure, a desired electrical conductance, and strong optical absorption in the solar spectrum. In this regard, the non-vacuum techniques have many drawbacks which include: poor reaction controllability; low crystal structure quality; low packing density of the absorber layer; adhesion loss at the absorber layer/substrate interface; and unavoidable impurity contaminations from many reaction additives such as residual reactants, by-products, surfactants, dispersants, and binders etc. which are required in a given process.

To solve these problems, one choice of non-vacuum methods is to synthesize nanoparticles in solution with a chemical composition that is appropriate for solar absorption by carrying out a wet reaction process followed by precipitation of the nanoparticles. U.S. Pat. No. 7,663,057 and No. 7,306,823 teach several methods of preparation of nanoparticles in solution that can contain the desired elements with an appropriate atomic ratio between the elements. However, just to synthesize these particles can require well over 48 hours of reaction time as shown in several examples in U.S. Pat. No. 7,663,057. These nanoparticles are then mixed with various additives to form a viscous paste or slurry or ink that can be coated onto a substrate to form a thin film. In these methods, although the nanoparticles have the desired composition, the chemical synthesis of these nanoparticles and the subsequent making of a paste or an ink both require large amounts of additives such as salt precursors, surfactants, binders, emulsifiers, thickening agents, and anti-foaming agents. The synthesis requires additional processing steps such as high temperature heating to remove these extraneous reagents and to form the final absorber layer. In addition, the above mentioned binders, thickening agents, and anti-foaming agents are mostly polymers that contain long chains of carbohydrate. Complete removal of these materials often requires annealing of the absorber layer under an oxygen-rich environment. This annealing process increases the risk of oxidizing the absorber layers, which are mostly sulfides, selenides, and tellerides. The oxidation damages the absorber layer and reduces the device's efficiency.

One application that requires the deposition of a CIGS layer onto a curved surface is the manufacture of cylindrical solar cells. See Buller and Beck; "Monolithic Integration of Cylindrical Solar Cells" U.S. Pat. No. 7,235,736. Two strategies were previously developed to deposit CIGS on these cylindrical surfaces, but each has drawbacks. The first method is to deposit the CIGS solar cells on a flexible substrate using standard techniques, such as physical vapor deposition (PVD), and then wrap the solar cell film around a tube which is then inserted inside a larger glass tube. The disadvantage of this wrapping approach is the shear stress which occurs in the film. CIGS is a ceramic material that is prone to cracking; the wrapping process can stress the film, reducing efficiency.

Another method that has been proposed is electrochemical deposition. However, though electrochemical deposition can be used to deposit a conformal absorber layer, deposition of all of the necessary elements from a single electrochemical deposition bath is difficult because of the large difference in deposition potentials of copper, indium, gallium, and selenium. While theoretically possible, no uniform deposition of CIGS from a single bath has been demonstrated. It is possible to electroplate each element in a series of four baths and subsequently fuse the layers in an annealing step, but a simpler method requiring fewer baths and no annealing step would be preferable to reduce equipment costs and the thermal budget.

With the exception of electrochemical deposition, all of the other methods that have been developed for depositing CIGS are line-of-sight techniques, which make them incompatible with deposition on complexly shaped surfaces. Methods based on physical vapor deposition, spray pyrolysis, or those that spray or sputter the source material from a nozzle or target cannot deposit a uniform coating on complexly shaped surfaces due to shadowing effects. In photovoltaic devices uniformity in the composition and thickness of the absorber material are critical to obtaining high efficiency devices.

Typical photovoltaic laminates comprise, in order: a substrate that acts as or is coated with a back electrode material; a photovoltaic CIGS or CZTS absorber layer; a window layer typically of CdS; a transparent electrode material, typically of intrinsic ZnO (i-ZnO) and/or aluminum doped ZnO (Al—ZnO) and a top electrical contact of a metal such as nickel, aluminum or other conductive metal. The laminate also often includes a final outer protective layer of anti-reflective material. Deposition of the i-ZnO intrinsic layer and Al—ZnO conductive layer are likewise typically deposited using line-of-sight techniques. Conductive zinc oxide has been prepared using a number of techniques, including magnetron sputtering, chemical vapor deposition, pulsed laser ablation, evaporation, spray pyrolysis, sol-gel preparation, and electrochemical deposition. Industrial preparation of Al—ZnO films has been limited almost exclusively to magnetron sputtering, as this method creates the most conductive thin films. However, this technique cannot be used to create a conformal coating because it is directional and not conformal. The only techniques that can be used to prepare a conformal coating are electrochemical deposition, sol-gel and chemical vapor deposition.

One method of forming a thin film, electrophoretic deposition (EPD), is a broadly acknowledged non-vacuum coating method employed in automotive, appliance, and general organic industries. During the process of EPD, surface-charged particles suspended in a liquid medium will migrate under the influence of an external electric field and be rapidly deposited onto an electrically conductive or semi-conductive surface having the opposite charge. High density films of metals, ceramics, polymers, semiconductors, or carbon have been deposited as described in the prior art such as in "*The mechanism of electrophoretic deposition*" by Brown and Salt in J. Appl. Chem., 15, 40 (1965), and in U.S. Pat. Nos. 3,879, 276; 4,204,933; 4,225,408; and 4,482,447. The above described prior art all require delicate procedures for making the nanoparticle suspension in solution, which involves chemical synthesis such as a metathetical reaction or a reduction reaction to form the nanoparticles, and the described EPD processes typically required assistance of specific acids or bases, stabilizers, and/or binding agents. In addition, some of the described processes required use of post-deposition high temperature treatments at 300 to 800° C. to form the final film as described in U.S. Pat. Nos. 4,204,933 and 4,225,408.

These delicate procedures disclose vulnerability and complexity in EPD process control and increase the processing cost accordingly. In addition, the use of chemical reactants and assisting additives will inevitably result in waste of raw materials and introduce chemical contaminations into the suspension and onto the deposited film. Thus, an EPD process has not found use in the highly desired production of large-scale solar panels.

It is highly desirable to provide a cost-effective, practical, and simple method for forming photovoltaic absorbing layers. Preferably the method requires minimum chemical additives during both formation of the nanoparticles and the subsequent coating of the nanoparticles onto a substrate to form a photovoltaic absorber layer. The method must ensure that the resultant absorber layer contains the desired chemical composition and that it allows for coating of complexly shaped surfaces of fabricated objects.

SUMMARY OF THE INVENTION

It is an object of the present invention to provide a non-vacuum-based method of depositing a photovoltaic absorber layer onto a complexly shaped surface of a substrate for use in a photovoltaic device, which is simple, cost-effective, and has minimal impurity contamination. According to a broad aspect of the invention, a method is provided comprising the steps of: providing nanoparticles comprising a combination of either one or more elements of groups IB, most preferably Cu, and IIIA with the option of including one or more group VIA elements or one or more elements of groups IB, most preferably Cu, and IIB and/or IVA with the option of including one or more group VIA elements; producing a stable colloidal suspension of the nanoparticles that are surface-charged in a non-aqueous liquid medium comprising at least one solvent and optionally an additive; depositing the surface-charged nanoparticles onto a complexly shaped surface of a substrate in a metal thin film using an EPD process by applying a voltage of 50-5000 volts (V) between the surface to be coated, which is at least semi-electrically conductive or has an at least semi-electrically conductive coating on it and a shaped counter electrode; finally, the metal thin film is converted into a metal chalcogenide film by heating the nanoparticle metal thin film in the presence of a chalcogen. A CdS buffer layer, an i-ZnO insulating layer, and an Al—ZnO transparent conducting oxide are then deposited over the metal chalcogenide thin film, with each being done using a chemical deposition technique. A chemical bath deposition is used to deposit the CdS buffer layer from $Cd^{2+}$ and thiourea precursors. A chemical vapor deposition is used to deposit the i-ZnO from diethyl-Zinc and oxygen precursors and to deposit Al—ZnO from diethyl-Zinc, diethyl-Aluminum, and oxygen precursors.

According to one aspect of the present invention, a unique non-vacuum method of depositing a photovoltaic absorber layer onto a substrate includes the step of physically breaking down a bulk source of the absorber materials into nanoparticles and then using EPD to deposit the nanoparticles onto a complexly shaped surface of a substrate. Compared to prior non-vacuum thin film deposition methods such as chemical reaction involved formation of nanoparticles followed by EPD and other non-EPD methods, the method of the present invention has significant advantages in providing high quality and process controllability, maximizing source material usage, and reducing process complexity and impurity contamination.

The above and other objects, features, and advantages of the present invention will be readily understood from the following detailed description taken in conjunction with the accompanying drawings.

DETAILED DESCRIPTION OF A PREFERRED EMBODIMENT

Although the following description is given for preferred embodiments of the invention for the purposes of illustration, it will be apparent that many variations and modifications can be effected by anyone of ordinary skill in the art without departing from the scope of the invention. Accordingly, the exemplary embodiments of the invention described below are set forth without any loss of generality to, and without imposing limitations on, the claimed invention.

In the present application, the following terms are defined as below, unless indicated otherwise.

"Nanoparticles" refers to particles having a size ranging from about 1 nanometer (nm) to 100 micrometer (µ) in at least one dimension.

"Surface-charged particles" refers to nanoparticles having a shield of charges at the interface between the particle surface and the surrounding liquid medium.

"Colloidal suspension" refers to a liquid system wherein surface-charged particles are microscopically suspended due to the electrostatic repel forces between the surface-charged particles.

Embodiments of the present invention provide a non-vacuum method of depositing a photovoltaic absorber layer onto a complexly shaped surface of a substrate for use in a photovoltaic device. While we do not exclude the possibility that electrodeposition, spray pyrolysis, paste coating, drop casting, screen printing, and the like may be used, at least in the past, for deposition, preferably the absorber layer is deposited by electrophoretic deposition (EPD), more particularly, preferably by EPD of a colloidal suspension comprising surface-charged nanoparticles in a non-aqueous liquid medium, wherein the nanoparticles are formed by physically breaking down a bulk solid of the same material. The EPD process is followed by post-deposition treatments.

Figure 1:
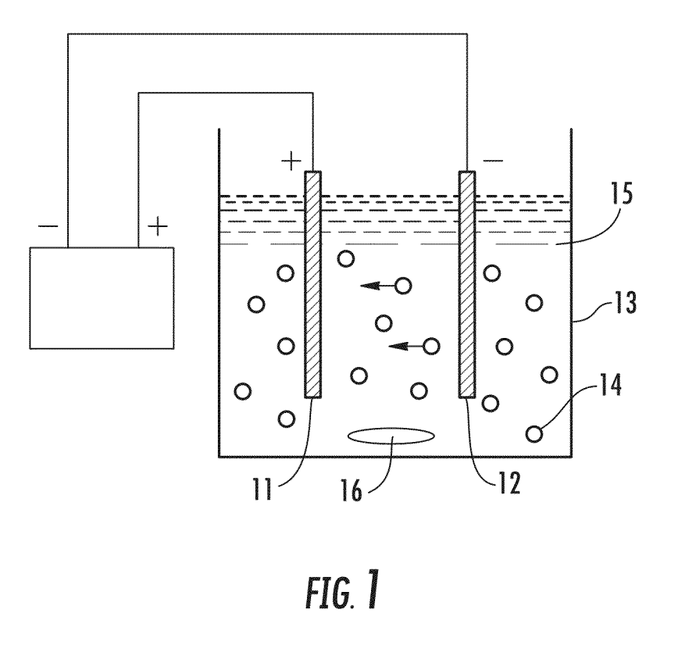
FIG. 1 is a schematic diagram showing an apparatus for carrying out an electrophoretic deposition of a colloidal suspension prepared according to an embodiment of the present invention.
Figure 2:
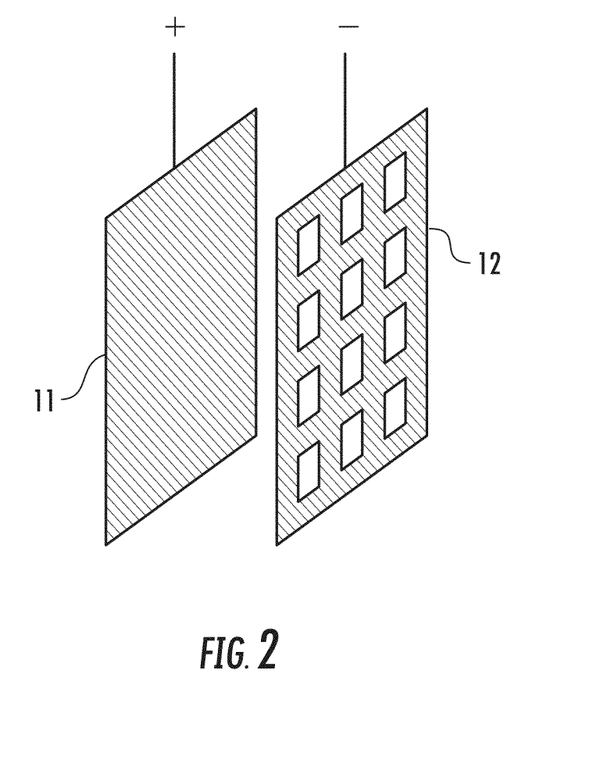
FIG. 2 is a schematic diagram showing a trimetric view of the electrodes in the apparatus of FIG. 1 according to an embodiment of the present invention.
Figure 3:
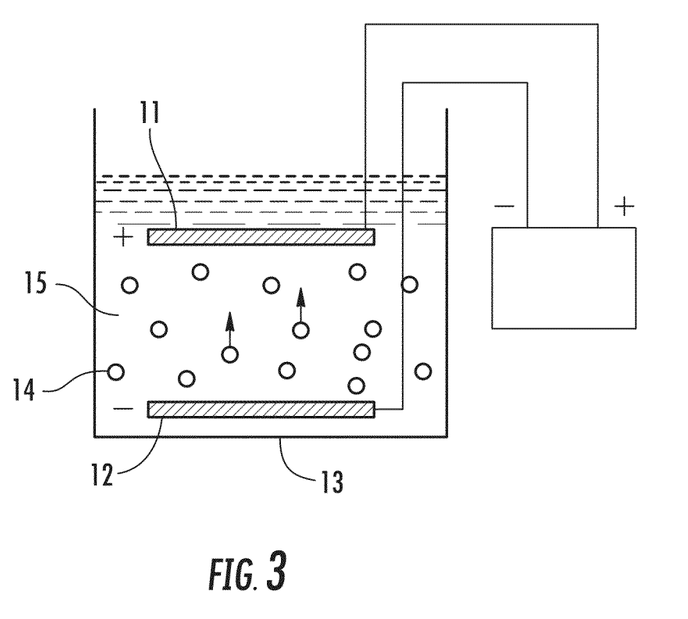
FIG. 3 is a schematic diagram showing an alternative horizontal positioning of the electrodes according to an embodiment of the present invention.

During the process of EPD, surface-charged particles suspended in a non-aqueous liquid medium will migrate under the influence of an external electric field and be deposited onto an electrically conductive or semi-conductive surface, usually charged oppositely to the particles, herein referred to as the "deposition electrode" or substrate. The migration is ultimately caused by the presence of the surface charge of the particles relative to the suspension medium. FIG. 1 is a schematic of an apparatus for carrying an EPD process according to the present invention. An electrical potential is applied across the deposition electrode 11 (e.g. + or − electrode) and the counter electrode 12 (e.g. − or + electrode). Both electrodes 11 and 12 are immersed in a container 13 holding the colloidal suspension, which comprises a plurality of surface-charged nanoparticles 14 (e.g. negatively-charged nanoparticles) and the liquid medium 15. Typically the suspension is stirred during deposition using a stirrer 16. When the nanoparticles 14 gain sufficient kinetic energy from the applied electric field between the electrodes 11 and 12, they will reach the deposition electrode 11 where their charges will be neutralized. The nanoparticles 14 will then be deposited on the deposition electrode 11 and form a close-packed thin film of the same material after the electrode 11 is taken out and dried. FIG. 2 shows a trimetric view of the electrodes, 11 and 12. FIG. 2 also illustrates that the counter electrode 12 may have a shape of a mesh or a grid with hollow center areas, or other shapes, to create the proper electrical field distribution and/or nanoparticle flow density to ensure a uniform deposition on the deposition electrode 11. FIG. 3 shows an alternative apparatus wherein the electrodes 11 and 12 are placed horizontally, which may be an option for manufacturing scale-up.

Generally, nanoparticle materials suitable for an EPD method include, but are not limited, to metals, alloys, semiconductors, ceramics, glass, polymers, or carbon. According to an embodiment of the present invention, and without loss of generality, the absorber layers for use in photovoltaic devices may be made from a mixture of nanoparticles comprising a combination of elements of groups IB, most preferably Cu, and IIIA, and optionally VIA of the periodic table of elements. In another embodiment, the mixture can comprise a combination of elements of groups IB, most preferably Cu, and IIB and/or IVA and optionally VIA elements of the periodic table of elements. The group IB elements preferably include copper (Cu), silver (Ag), or gold (Au). Group IIIA elements suitable for use in the method of this invention include aluminum (Al), gallium (Ga), and indium (In). Preferably the group IIIA elements are Ga and In. Group IIB elements suitable for use in this invention include zinc (Zn), cadmium (Cd), and mercury (Hg). Preferably the group IIB element is Zn. Group IVA elements suitable for use in this invention include silicon (Si), germanium (Ge), tin (Sn) and lead (Pb). Preferably the group IVA element is Si or Sn. Group VIA elements suitable for use in various embodiments include selenium (Se), sulfur (S), and tellurium (Te). For convenience in description, elements that are possibly able to be combined or interchanged are commonly put in a set of parentheses, for example, (Al,Ga,In) or (S,Se,Te). The nanoparticles may contain one material or a mix of two or more materials from elemental metals, binary or ternary alloys, and binary or ternary or quaternary compounds. For convenience, hyphen ("—") is used to connect elements together and indicates all known binary, ternary, or quaternary alloys or compounds of the elements joined by the hyphen. For example, "Cu—In" indicates all know binary alloys that include both Cu and In elements such as $Cu_2In$, $Cu_4In$, $Cu_{11}In_9$, and the like. Preferably, nanoparticles used in the method of the present invention comprise one or more of the following materials: Cu, Ag, Ag, Al, Ga, In, Zn, Si, Sn, S, Se, Te, Cu—Ag, (Al,Ga)—In, (Cu,Ag)—(Al,In,Ga), (Cu,Ag)—Zn, (Cu,Ag)—(Si,Sn), Zn—(Si,Sn), (Cu,Ag)—(S,Se,Te), (Al,Ga,In)—(S,Se,Te), Zn—(S,Se,Te), (Si,Sn)—(S,Se,Te), (Cu,Ag)—(Al,Ga,In)—(S,Se,Te), (Cu,Ag)—(Si,Sn)—(S,Se,Te), (Cu,Ag)—Zn—(Si,Sn)—(S,Se,Te), and the like. More preferably, the nanoparticles comprise one or more materials selected from binary and ternary alloys of Cu—In, Cu—Ga, In—Ga, (Al,Ga)—In, Cu—(Al, In, Ga), Cu—Zn, Cu—Sn, and Zn—Sn, and binary or ternary or quaternary compounds of Cu—(S,Se), (Al,Ga,In)—(S,Se), Zn—(S,Se), Sn—(S,Se), Cu—(Al,Ga,In)—(S,Se), and Cu—Zn—Sn—(S,Se).

For most applications, the group IB element used in both embodiments is Cu. When selecting materials from the above lists, the atomic ratios or equivalently the molar ratios between the group IB, IIIA, and VIA elements or between group IB and (IIB+IVA) and VIA elements, e.g. Cu:(In+Ga):Se for CIGS and Cu:(Zn+Sn):S for CZTS absorber layers, are carefully adjusted to the predetermined ratio of within a few percent near the ideal chemical composition of the objective photovoltaic absorber layer. Thus, for example, Cu:(In+Ga):Se should have an atomic ratio of approximately 25%:25%:50% and Cu:(Zn+Sn):(S+Se) approximately at 25%:25%:50% plus or minus 15%, most preferably plus or minus 5%. The range of 15% to 5% is required for practical reasons. Loss of, for example, Cu or In or Se during the process, especially considering the high vapor pressure of In—Se compounds and of elemental Se requires that the acceptable ratio ranges be extended to plus or minus 15%. In the case in either embodiment where the optional group VIA elements are not present the ratio of group IB (Cu) to IIA elements is 50%:50% and the ratio of group IB (Cu) to (IIB+IVA) elements is also 50%:50%, both ratios preferably plus or minus 5% and acceptably plus or minus up to 15%.

The nanoparticles may also be prepared as a chemical complex. For example, CIGS nanoparticles may be synthesized through various chemical reaction methods as described in the sonochemical method by J J. Zhu, Chem. Mater. 12, 73, (2000); thermolysis described by M. A. Malik et. al. Adv. Mat. 11, 1441 (1999); and pyrolysis described by S. L. Castro et. al. Chem. Mater. 15, 3142 (2003) such that the resultant nanoparticle contains the desired chemical composition.

The nanoparticles may have a plurality of shapes including but not limited to nanospheres, nanorods, nanowires, nanocubes, nanoflowers, nanoflakes, mixtures of these shapes and the like, depending on the bulk material properties and fabrication method. The desired size of the nanoparticles suitable for the method of the present invention ranges between about 1 nm and 100μ in at least one dimension, preferably between about 1 nm and about 500 nm in at least one dimension. According to an embodiment of this invention, a thin oxide layer may be formed on the surface of the nanoparticle, depending on the particle fabrication method and the liquid medium of the colloidal suspension.

According to an embodiment of the present invention, the nanoparticles are prepared by physical breakdown of bulk source materials, wherein the nanoparticles and the bulk materials have an identical chemical composition. The nanoparticles may be prepared in a preferred liquid medium to form the colloid suspension, or they may be prepared in but not limited to, a vacuum, a gas medium, or a liquid medium, and then re-dispersed in a preferred liquid medium to form the colloid suspension. Methods of preparing the nanoparticles include but are not limited to pulsed laser ablation, laser pyrolysis, arc discharge, thermal evaporation, plasma evaporation, evaporation-condensation, and mechanical ball milling of the bulk material. During laser ablation of a bulk target material in liquid a high energy laser pulse is directed at a metal target surface. The bulk target material comprises the CIGS or CZTS material of interest. The very short duration laser pulses, on the order of femtosecond to picoseconds, create a plasma which is rapidly cooled by the solvent and forms a nanoparticle colloidal suspension. The laser ablation process maintains the stoichiometry of the metal target in the nanoparticles to within 10%. Another method for formation of nanoparticle colloidal suspensions includes the explosion of thin metal wires, in which metal wires on the order of 1-50 microns may be exploded in solution by applying an increasing DC voltage until they explode. The resulting plasma is rapidly cooled in solution and can form a stable nanoparticle colloidal suspension. Using these methods, a nanoparticle colloidal suspension can be prepared which is largely free of impurities, since no capping agents, or other salts, are necessary to stabilize the particles. These methods, indicated as the "physical breakdown methods" suitable for this invention, have an advantage of providing easy controllability of the chemical composition of the nanoparticles by simply adjusting the composition of the source bulk material. In addition, the formation of the bulk material can use a plurality of methods not limited by EPD considerations, and therefore much more complex bulk materials can be prepared. The use of physical breakdown of bulk materials allows the EPD process to have better film quality control, maximizes material usage, and at the same time reduces process complexity.

By way of contrast, we use "chemical synthesis methods" to denote the particle preparation methods used in prior art EPD processes of Brown and Salt, and U.S. Pat. Nos. 3,879, 276, 4,204,933, 4,225,408, and 4,482,933, and in prior art of other non-vacuum deposition techniques such as the sonochemical reaction described by J J. Zhu, Chem. Mater., 12, 73, (2000), thermolysis described by M. A. Malik et al., Adv. Mat., 11, 1441, (1999), pyrolysis described by S. L. Castro et al., Chem. Mater., 15, 3142, (2003), and spray coprecipitation described in U.S. Pat. No. 7,663,057. In these chemical synthesis methods, compositional control of the synthesized nanoparticles is much more challenging since several reactants/precursors, electrolytes, surfactants/dispersants are employed in the process, and each of them may affect the composition of the deposited film individually. In addition, the inactive part of the reactants/electrolytes, usually the anion part, and the residual by-products, surfactants/dispersants or other additives are typically macromolecular compounds that are difficult to fully decompose, or to be fully eliminated from the final product by post-deposition treatments. In the prior art use of EPD, acids and/or bases are commonly employed for altering the pH value and conductivity of the colloidal suspension, e.g. "*Electrophoretic deposition of materials*" Van der Biest and Vandeperre, Annu. Rev. Mater. Sci. 29, 327 (1999). The use of acid/base may induce undesirable formation of by-products, such as $H_2$ and $O_2$ gases, at the electrodes, and interfere with the film deposition. Only by incorporating the physical breakdown method of the present invention into the EPD process as stated in this invention, can one effectively avoid undesirable by-product formation, maximize source material usage, and reduce chemical contaminations in the final product of the invention.

Because the nanoparticles may be deposited over large or small areas, which may vary by several orders of magnitude, different techniques for generating the metal nanoparticle colloidal suspension are to be considered. Small quantities of nanoparticles, for example enough to coat several square feet, may be prepared using laser ablation in a liquid. One benefit is the nanoparticles maintain the stoichiometry of the target material. Large quantities of nanoparticles, for example as utilized in a CIGS solar cell deposited on a car body, may be produced by chemical methods or other suitable large scale production methods. The choice may be determined based on area-speed tradeoffs for a particular application.

A stable suspension of nanoparticles with surface charges is needed for the EPD process according to the present invention. Migration of these nanoparticles driven by a strong electric force is recognized to be of a physical nature rather than of a chemical nature. The nanoparticles may have a positive surface charge or a negative surface charge depending on the nature of the liquid medium and on the bulk materials from which the nanoparticles are formed. Under the influence of a strong electric field, the charged particles will move away from the counter electrode, which has the same charge as the nanoparticles and toward the oppositely-charged deposition electrode or substrate. The flux of particles to the surface can be controlled by varying the voltage, solid loading, or the c-potential of the particles. Once at the surface, the particles deposit on the surface either by electrochemical reduction of the particle or by sedimentation. In the former case, a positively-charged particle is reduced to the metal at the substrate. In the latter case, the moving particles exert a pressure near the surface of the electrode which causes them to sediment onto the surface. In both cases the result is creation of a close-packed metal thin film on the surface of the substrate deposition electrode. According to an embodiment of the present invention, preferably the surface-charged nanoparticles in a stable suspension have an absolute value of zeta potential greater than 10 milliVolts (mV). Zeta potential ($\zeta$) is used to represent the degree of repulsion between adjacent surface-charged nanoparticles. It is determined from the velocity (v) with which the nanoparticle moves under an electric field (E) according to the following equation: $\zeta = (4\pi\eta v)/(\in E)$, where $\eta$ and $\in$ are the viscosity and dielectric constant of the liquid medium, respectively.

In aqueous solutions water splitting occurs at potentials greater than 1.23 V, and the formation of hydrogen bubbles on the cathode can disrupt film formation. To avoid these bubbles, non-aqueous solvents can be used in the present invention. The non-aqueous liquid medium of the colloidal suspension may be one solvent or a mixture of two or more solvents, wherein the solvents include but are not limited to organic and non-organic liquids, preferably single phase polar organic liquids. The polar organic liquid may have a large dielectric constant of more than 10, and more preferably of more than 20. General classes of the polar organic liquids suitable for this invention include but are not limited to, alcohols, ethers, ketones, esters, amides, nitriles, and diols, and the like. Preferably the formula of the polar organic liquid contains 1-6 carbon atoms. A non-aqueous medium is preferred over an aqueous medium, to avoid potential electrolysis of water and gas formation at the electrodes, which may interfere with the deposition process.

Some embodiments may employ one or more suitable additives to improve the stability and conductivity of the colloidal suspension, or to improve adhesion of the deposited photovoltaic absorber layer at the absorber layer/substrate interface. Such additives include but are not limited to, acids, bases, electrolytes, and surfactants/dispersants which are well known in the colloidal art. However, in various embodiments, such additives should be removable from the absorber layer during or after deposition. Particularly, additives are chosen to ensure that they do not disadvantage the process or the product of the invention.

Generally, the substrate on which the absorber layer is deposited is electrically conductive or semi-conductive, and is directly connected to or is the deposition electrode, wherein the deposition surface faces the counter electrode. The polarity of the deposition electrode, either positive or negative, is determined as an opposite charge to the charge polarity of the nanoparticles. The substrate also acts as the bottom contact in a photovoltaic device. It may be in the form of, but is not limited to: (1) a rigid sheet of glass with a conductive coating, preferably a metal coating and more preferably a molybdenum coating; (2) a flexible sheet of a metal or an alloy, including but not limited to molybdenum, titanium, stainless steel, or aluminum, with or without additional coatings; or (3) a flexible polymeric sheet having a conductive coating, preferably a metal coating and more preferably a molybdenum coating. The suitable polymers for forming the polymeric sheet include, but are not limited to, polyimides, polyethylene terephthalate, or polyethersulphone. In embodiments wherein a metal or an alloy substrate is used, it would be desirable but not necessary to cover the backside of the substrate with a blocking material such as an insulating tape or membrane to inhibit useless deposition on the back side of the substrate. It would also be desirable to pre-coat a thin layer of molybdenum and/or an intermediate blocking layer on the metal sheet to improve adhesion and inhibit interdiffusion between the metal substrate and the deposited film as described in U.S. patent publication no. 2009/0305455. Obviously, the present method also allows for a portion of a complexly shaped surface to be converted to a solar cell depending on the area that is at least semi-electrically conductive since this is the only portion where the nanoparticles will be deposited by EPD.

The counter electrode is typically made of either a conductive metal or a conductive alloy, including but not limited to, stainless steel, molybdenum, nickel, titanium, platinum, gold, or a metal-coated glass sheet. Unlike the deposition electrode substrate, the shape of the counter electrode may be deliberately altered to change the electric field distribution. When the counter electrode is also a planar sheet, although the electric field between planar electrodes is uniform, the deposited film is usually non-uniform, e.g. thinner at the center and thicker at the edge of the substrate. This phenomenon is more apparent when the distance between the two electrodes is decreased to obtain a stronger electrical field. This phenomenon is due to the small spacing limiting the number of nanoparticles that are able to migrate to the center of the substrate for deposition. To ensure uniform coating on the deposition electrode, the counter electrode may be configured in the form of a mesh or a sheet with hollow center areas. FIG. 2 illustrates one embodiment of the current invention wherein a counter electrode with rectangular-shaped holes is employed.

The voltage applied to the electrodes, the distance between the electrodes, and the current density employed on the electrodes may be configured in light of the intensity of the electric field required for the deposition of the nanoparticles. Depending on the nanoparticle properties and electrode size, the applied voltage may be direct current (DC) or alternating current (AC) and may be either continuous or pulsed. The electrical potential is preferably from 1 to 5000 Volts (V), more preferably from 25 to 5000 V. The distance between the electrodes is preferably from 0.1 to 100 centimeters (cm), more preferably from 0.5 to 10 cm. The current density is preferably from 0.001 to 10 milliAmps/centimeter$^2$ (mA/cm$^2$), more preferably from 0.01 to 1 mA/cm$^2$.

The deposition speed is determined by the operating parameters. In some embodiments, a 0.5 to 2 micron (μm) thick film with a good packing density may be deposited by the current method in a short time of from 30 seconds to 5 minutes. The deposition speed of the current method is much faster than the conventional vacuum-based techniques, and is among the fastest compared to other non-vacuum-based techniques in terms of depositing a thin film photovoltaic absorber layer with similar packing density.

This technique offers several unique advantages. First, the precursor is fluid, so deposition is conformal, which is unique to our method. Second, the bandgap can be graded by doing multiple depositions with nanoparticles of different compositions. Third, electrophoretic deposition is well established. Electrophoretic deposition has been used to deposit primer layers on car bodies, and the process and composition of the precursor solution is well known in the art. Electrophoretic deposition production lines large enough to accommodate platform trailers have been utilized to apply paint primer coats, which demonstrates the general application of the deposition process for coating large surface areas. According to an embodiment of the present invention, virtually all of the nanoparticles in the liquid medium may be deposited under an optimized configuration of the EPD process onto the substrate. Thus, the material usage is much more efficient in the current method compared to the conventional vacuum-based and other non-vacuum-based techniques. Therefore, the current method helps to reduce the environmental footprint of the process of forming a photovoltaic absorber layer.

Figure 4:
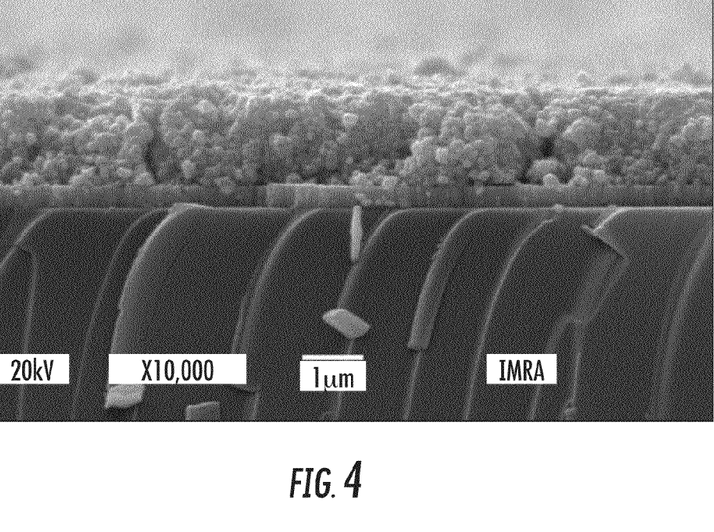
FIG. 4 is a scanning electron microscopy image showing a cross-sectional view of a Cu—In alloy photovoltaic absorber layer prepared according to an embodiment of the present invention.
Figure 5:
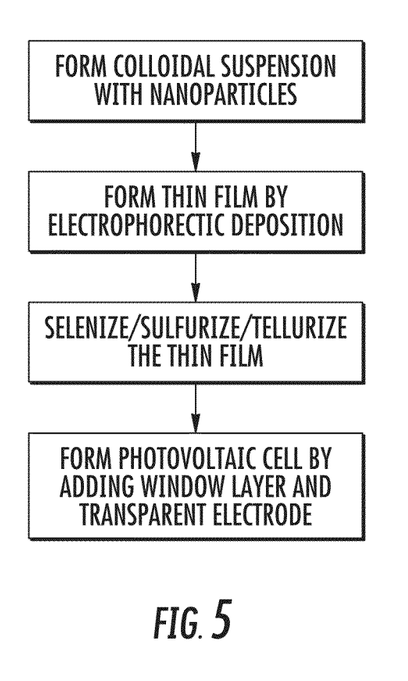
FIG. 5 is a flow diagram illustrating a process of fabricating a photovoltaic cell according to an embodiment of the present invention.

By way of an example, FIG. 4 displays a cross-sectional scanning electron microscopy image of a Cu—In alloy film of 1.5 μm thickness deposited on a molybdenum coated glass substrate according to the current method. Pulsed laser ablation was employed to generate the Cu—In alloy nanoparticles in acetone. The laser pulse repetition rate was preferably about 500 kilo-Hertz. The pulse energy was preferably about 8 micro-Joule. The ultrashort laser pulse duration is preferably between 0.1 to 1 picosecond. The target ablated by the laser was a commercial sputtering target purchased form SCI Engineering Materials Inc. containing 50% Cu and 50% In. The size of the ablated nanoparticles ranged between about 1 nm and 500 nm in diameter. The nanoparticles were deposited by EPD under an applied DC voltage of about 400 V, with a current density of about 0.2 mA/cm$^2$. The distance between the electrodes was about 1 cm. To qualify for photovoltaic application, the film deposited by the current method generally requires further post-deposition treatment of chalcogenization, including but not limited to selenization or sulfurization or tellurization, and/or annealing as illustrated in the flow chart of FIG. 5. Chalcogenization will transform the initially deposited absorber layer into an absorber layer with the desired structure of a chalcopyrite or a kesterite, or improve the film structural quality and optical and electrical properties if the initially deposited layer already has the desired structure. By way of an example, the film may be selenized by exposing the layer to a selenium vapor at a temperature of between 200 and 700° C. for 5 to 60 minutes.

Figure 6:
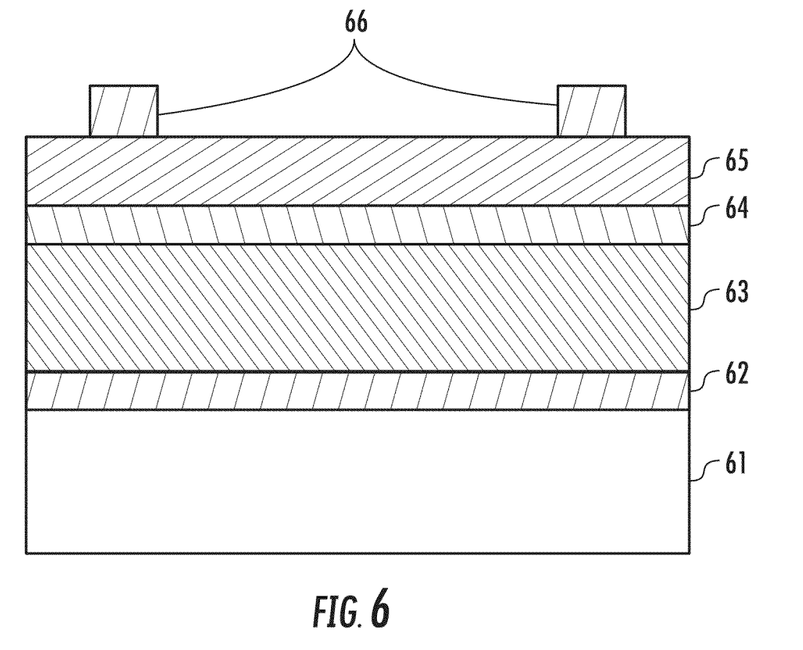
FIG. 6 is a schematic diagram showing a photovoltaic cell designed according to an embodiment of the present invention.
Figure 7A:
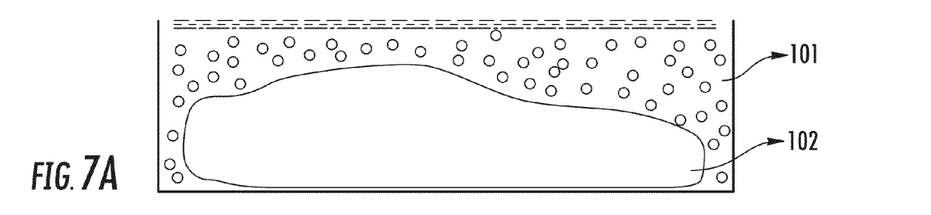
FIGS. 7A to 7E schematically illustrate a method for the preparation of a CIGS solar cell on a complexly shaped surface of a fabricated object such as a car body.
Figure 7B:
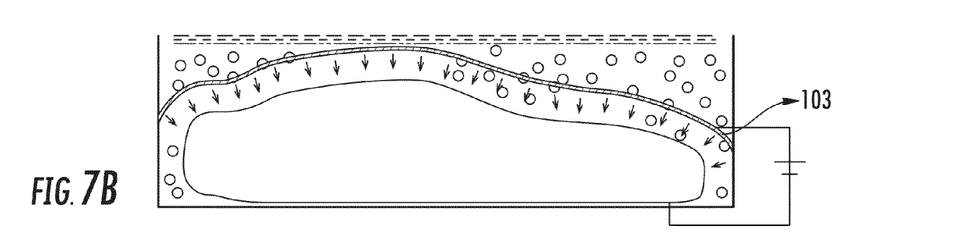
Figure 7C:
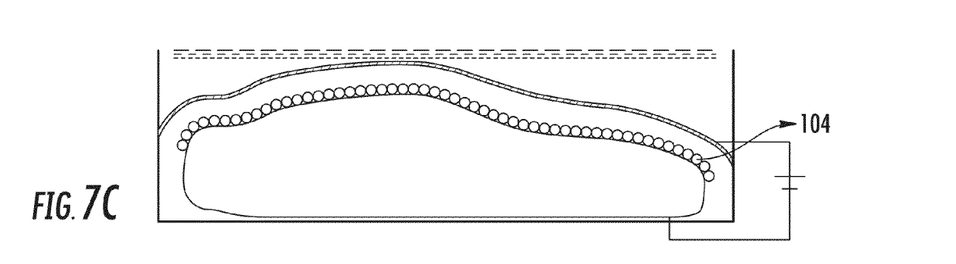
Figure 7D:
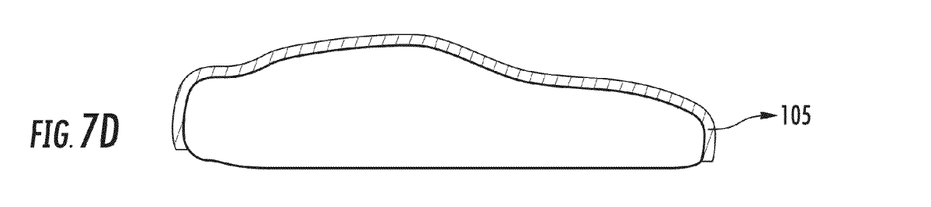
Figure 7E:
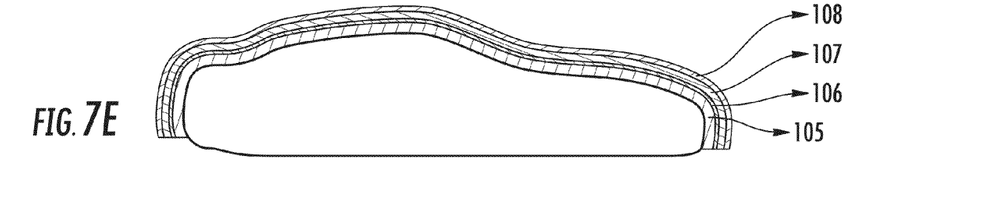

FIG. 6 is a schematic diagram showing the structure of a photovoltaic cell designed according to an embodiment of the present invention, comprising a supporting substrate 61 of glass coated with a back electrode 62 of a molybdenum layer, an IB-IIIA-VIA or IB-IIB-IVA-VIA photovoltaic absorber layer 63 obtained using the method of the present invention, a window layer 64 of cadmium sulfide (CdS), a transparent electrode 65 of zinc oxide (ZnO) and/or aluminum doped zinc oxide (Al—ZnO), and a top contact 66 of nickel, aluminum, or other metal. The window layer 64 is typically deposited by a chemical bath deposition with a thickness of about 50 nanometers. The transparent electrode 65 and the top contact 66 are typically deposited by sputtering or evaporation.

The method for fabricating a photovoltaic absorber layer according to the present invention has excellent reproducibility and stability. The present invention may also be used to fabricate other devices including photodetectors, photoelectrochemical cells, solid oxide fuel cells, supercapacitors, ceramic matrix/fiber composites and other energy conversion or energy storage devices.

FIGS. 7A to 7E and 8A to 8G illustrate examples for forming CIGS/CZTS layers on complexly shaped surfaces of fabricated objects, which may be greatly different in size and geometry. Corresponding features, appearing in both FIGS. 7 and 8, are designated by the same number. FIGS. 7A to 7E illustrate one implementation of the present invention in which a CIGS/CZTS solar cell is deposited on a car body. FIGS. 8A to 8G illustrate another implementation in which a CIGS/CZTS solar cell is deposited on the inside of a cylinder using a superstrate device configuration The methods illustrated in FIGS. 7 and 8 provide a low-cost, solution-based technique for growing CIGS or CZTS films on a complexly shaped fabricated objects, for example an object having at least one surface with a curved portion or multiple non-planar surfaces. Such a complexly shaped surface may be characterized as having substantially smooth three-dimensional topography, but in which the topography of the surface may vary substantially, as characterized by the variation in surface height, or by variation in the surface normal along at least a portion of the surface. A surface may comprise one or more planar portions with surface normal oriented along different directions. The surface of the complexly shaped fabricated object may comprise convex and/or concave portions suitably oriented for use in a deposition process.

The examples of FIGS. 7 and 8 illustrate a rather wide range of size variations. Many other possibilities include complex fabricated objects having an outside dimension (e.g.: outer diameter) in a range from millimeters to tens of meters, for example. Thus, in accordance with embodiments and examples described herein, the invention extends fabrication of metal chalcogenide solar cells to three-dimensions, and without a requirement for coplanarity of the substrate surface.

In various embodiments deposition of a CIGS solar cell on a complexly shaped surface according to the present invention includes: generating a nanoparticle colloidal suspension; depositing the suspension via EPD onto the complexly shaped surface to create a metal thin film on the surface; converting the metal thin film into a metal chalcogenide thin film; and using chemical deposition techniques to deposit the CdS and i-ZnO and/or Al—ZnO layers.

Referring to FIGS. 7A to 7E and 8A to 8G, the nanoparticle colloidal suspension 101 is composed of metal nanoparticles. Generally, nanoparticle materials suitable for an EPD method include, but are not limited, to metals, alloys, semiconductors, ceramics, glass, polymers, or carbon. For making a CIGS solar cell the particles can comprise Group IB, Group IIIA and optionally, Group VIA elements. The Group IB elements include Cu, Ag and Au with Cu being preferred. The Group IIIA elements include Al, Ga and In with a mixture preferred. The Group VIA elements include Se, S and Te, and these are typically added in the chalcogen conversion phase. Preferably, the nanoparticle colloidal suspension comprises Cu, In, $Cu_XGa_Z$ $Cu_XIn_Y$, or $Cu_XIn_YGa_Z$. The atomic ratio of Cu/(In+Ga) is in the range of 0.7-1.0 and the atomic ratio of Ga/(Ga+In) is in the range of 0.1-0.5. The ratio of Cu/(In+Ga) largely determines the carrier concentration of the semiconductor device. If the ratio is less than 0.95, the semiconductor will be an n-type. If the ratio is greater than 0.95, the semiconductor will be a p-type. The ratio of Ga/(Ga+In) can be tuned to modify the bandgap. The bandgaps of $CuInSe_2$ and $CuGaSe_2$ are 1.02 eV and 1.65 eV, respectively. The optimal bandgap for a single junction device is about 1.5 eV. Partially replacing In with Ga increases the bandgap, which improves the energy-conversion efficiency and also decreases cost by reducing the amount of In used. The nanoparticle colloidal suspension can be composed of any mixture of Cu, In, $Cu_XGa_Z$, $Cu_XIn_Y$, and $Cu_XIn_YGa_Z$ nanoparticles as long as the suspension is stable and the correct ratio of metals is used. Other metal chalcogenide materials, such as CZTS, can also be prepared from suitable metal nanoparticle precursors. In the case of CZTS, the preferred combination includes Group IB elements, Group IIB and/or Group IVA elements and optionally Group VIA elements. The Group IB elements include Cu, Ag and Au with Cu being preferred. The Group IIB elements include Zn, Cd, and Hg with Zn preferred. The Group IVA elements include Si, Ge, Sn and Pb with Si or Sn preferred. The Group VIA elements include Se, S and Te, and these are typically added in the chalcogen conversion phase. Preferably nanoparticle colloidal suspensions of Cu, Zn, Sn, $Cu_XZn_Y$, $Cu_XSn_Y$, $Zn_XSn_Y$, or $Cu_XZn_YSn_Z$ are used.

Figure 8A:
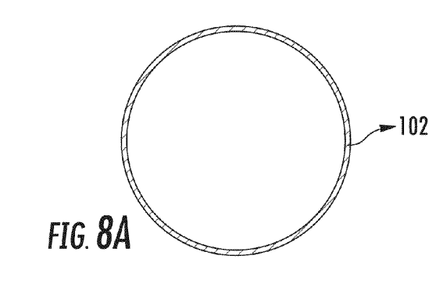
FIGS. 8A to 8G schematically illustrate a method for the preparation of a CIGS solar cell in a complexly shaped surface of an object, namely the inside of a glass tube in a superstrate configuration.
Figure 8B:
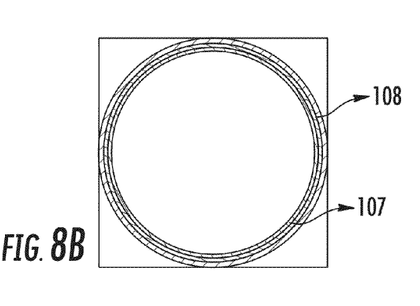
Figure 8C:
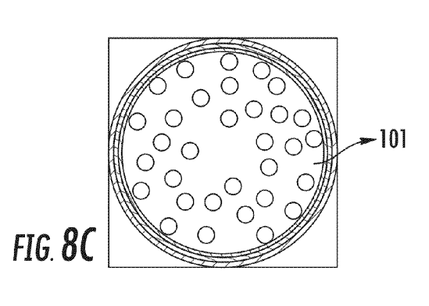
Figure 8D:
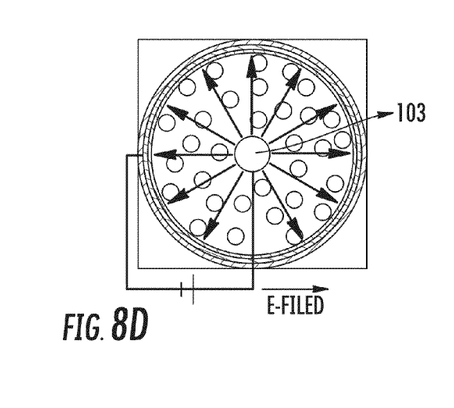
Figure 8E:
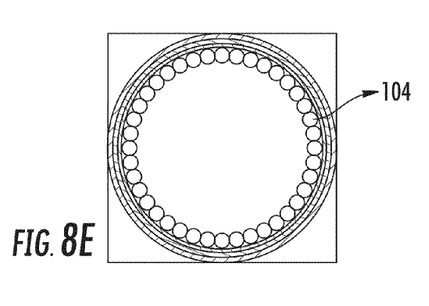
Figure 8F:
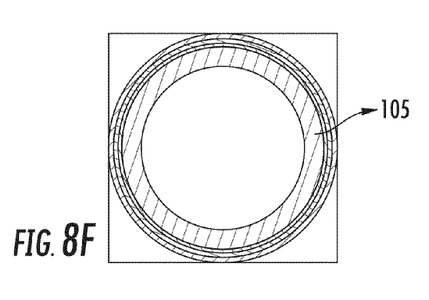
Figure 8G:
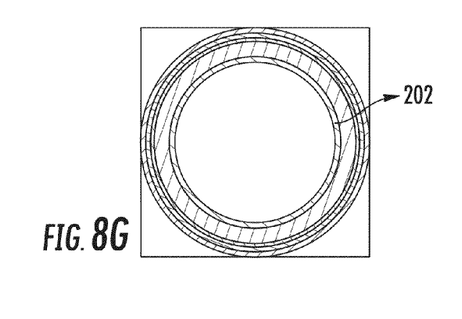

Even deposition of the precursor nanoparticle suspension onto a complexly shaped surface of a substrate requires that the shape of the counter electrode 103 needs to be designed such that the electric field is uniform over the surface of the substrate. In the case of a highly symmetric object, like a cylinder, deposition on the inside of the object can be accomplished using a rod-shaped counter electrode 103 as shown in FIG. 8D.

In the case of a more complexly shaped object, such as the car body shown in FIGS. 7A to 7E, the shape of the counter electrode 103 needs to be designed by solving Gauss' Law, as given in EQ1 below:

$$E = -\nabla \phi \tag{EQ1}$$

where E is the electric field and $\phi$ is the electric potential, with the given substrate surface and under the condition that the electric field is the same at all points between the plates of the deposition electrode 102, as defined by the complex shape, and the counter electrode 103. The geometric shape and the constraint of the electric field determines the shape of the counter electrode 103. Determining the appropriate counter electrode shape can be done using commercially available physics simulation packages such as COSMOL multiphysics modeling and simulation software. The data of the shape of the substrate can be determined using three dimensional laser scanning of the surface, laser stylus contouring, or from CAD/CAM data used to create the substrate surface.

The EPD deposition of the nanoparticles on the surface of the substrate 102 forms a metal thin film 104 which is then converted into a metal chalcogenide thin film 105 by exposing the metal thin film 104 to a chalcogen vapor at an elevated temperature of from 200 to 700° C. for 5 to 60 minutes. The chalcogen vapor can be composed of any of the reactive sulfur or selenium species, such as $S_2$, Se, $H_2S$ or $H_2Se$. The sample is placed in sealed container and the reactive gas is either generated in-situ or pumped in. The sample can be heated to facilitate conversion of the metal thin film 104 to a metal chalcogenide thin film 105. In addition, the reaction can be carried out at low pressure by evacuating the reaction vessel or at atmospheric pressure by flowing argon or nitrogen though the cell. Another method for conversion of the metal thin film 104 into a metal chalcogenide thin film 105 is to electrodeposit selenium and/or sulfur and then heat the sample to 200 to 700° C. The deposited selenium and/or sulfur will diffuse into the metal thin film 104 and convert it to a metal chalcogenide thin film 105. Irrespective of how formed, preferably the metal chalcogenide thin film has a thickness of from 100 nm to 10μ.

Chemical deposition techniques can be used to deposit a buffer layer 106, an insulating layer 107, and a transparent conducting oxide layer 108. In this technique, a fluid precursor undergoes a chemical change at a solid surface, leaving a solid layer. Since the fluid precursor surrounds the solid object, deposition happens on every surface, regardless of direction, and thin films from chemical deposition techniques are conformal. Chemical deposition is further categorized by the phase of the precursor. Chemical bath deposition (CBD) uses a liquid precursor, usually a solution of organometallic powders dissolved in an organic solvent. This is a relatively inexpensive, simple thin-film process that is able to produce stoichiometrically accurate crystalline phases. Chemical vapor deposition (CVD) generally uses a gas-phase precursor. In the case of Metal-Organic Chemical Vapor Deposition (MOCVD), an organometallic gas is used. In the present invention, preferably use is made of diethylzinc, water vapor, and diethylaluminum as precursor gasses. The buffer layer may be composed of CdS, Zn(O,S) (zinc oxysulfide), InS, or other related materials which passivate the CIGS surface and/or form a PN junction with the CIGS material to improve carrier collection. The insulating layer may be composed of i-ZnO, i-In$_2$O$_3$, or other related materials which form a homojunction with the transparent conducting oxide and prevent shunting in the device. The transparent conducting oxide may be composed of Al—ZnO, F—ZnO, In—SnO, carbon nanotubes, conducting polymers, graphene, or any other suitable transparent conducting material. Chemical deposition is one method currently used to deposit these materials, but other methods which deposit a conformal coating such as EPD or electrodeposition could also be used. In the case of a superstrate cell, such as the one shown in FIGS. 8A to 8G, deposition of the CdS buffer layer 106 may be omitted; however deposition of a back electrode layer 202 is included FIG. 8G.

Some examples of precursor preparation and formation of a metal chalcogenide thin film are discussed in the following paragraphs.

By way of example, a suitable precursor solution was prepared as follows. In this section, all chemicals were used as received. CuIn nanoparticles were prepared by laser ablation of a CuIn 50:50 alloy target from SCI Engineered Materials in acetone, Alfa Aesar, Spectrophotometric grade, 99.5% purity, as the solvent. An IMRA America D-10K fiber laser system was used to produce the particles. The laser output was tuned to 3 W and a repetition rate of 500 kHz, 2 μS pulse repetition, was used, yielding pulse energies of 6 μJ. A Scanlab hurry-SCAN II system was used to scan the beam across the CuIn target surface. When the beam was focused on the target surface, nanoparticles were produced at a rate of 179 μg/min.

By way of example, the colloidal nanoparticles were deposited on a substrate electrode as follows. Electrophoretic deposition was conducted in a two-electrode cell with the electrodes spaced 2.54 centimeters apart. In the case of a substrate cell, as demonstrated in FIG. 1, a 1 cm$^2$ Mo sheet which was 0.010" thick, Alfa Asear, was used as the cathode deposition electrode, and a stainless steel foil was used as the anode counter electrode, K&S Engineering. The nanoparticles were deposited by applying a bias of 100V between the electrodes using a Keithley 2410 1100V source meter.

By way of example, the metal thin film formed on the Mo sheet was converted to a metal chalcogenide thin film by the following method. The metal thin film was placed in a tube furnace along with a solid piece of Se as the source chalcogen. The container was purged of oxygen by flowing Ar at a rate of 20 cc min$^{-1}$. Subsequently, the tube furnace was heated to 450° C. for 30 minutes and then the substrate was allowed to cool.

Thus, while only certain embodiments have been specifically described herein, it will be apparent that numerous modifications may be made thereto without departing from the spirit and scope of the invention. It is to be understood that the arrangements are not mutually exclusive, and elements may be combined among embodiments in suitable ways to accomplish desired design objectives. Further, acronyms are used merely to enhance the readability of the specification and claims. It should be noted that these acronyms are not intended to lessen the generality of the terms used and they should not be construed to restrict the scope of the claims to the embodiments described therein.

The foregoing invention has been described in accordance with the relevant legal standards, thus the description is exemplary rather than limiting in nature. Variations and modifications to the disclosed embodiment may become apparent to those skilled in the art and do come within the scope of the invention. Accordingly, the scope of legal protection afforded this invention can only be determined by studying the following claims.

What we claim is:

1. A method for fabricating a conformal metal chalcogenide thin film photovoltaic absorber layer on a surface of a complexly shaped object, the method comprising the steps of:
   a.) providing a stable colloidal suspension of metal surface-charged nanoparticles in a non-aqueous solvent, said nanoparticles comprising elements either from Groups IB, IIIA and optionally Group VIA or from Groups IB, IIB and/or IVA and optionally Group VIA;
   b.) providing a counter electrode for electrophoretic deposition of said nanoparticles, said counter electrode having a pre-determined shape determined by a surface topography of a surface of a complexly shaped object and providing a substantially constant-electric field constraint between said counter electrode and said surface of said complexly shaped object, said surface being at least semi-electrically conductive;
   c.) placing said counter electrode and said surface of said complexly shaped object into said suspension of metal surface-charged nanoparticles and using electrophoretic deposition forming a metal thin film on said surface of said complexly shaped object; and
   d.) heating said metal thin film in the presence of a chalcogen to form a metal chalcogenide thin film on said surface of said complexly shaped object.

2. The method of claim 1, wherein said nanoparticles comprise Cu, Ga and In and wherein the atomic ratio of Cu:(Ga+In) is from 0.7 to 1.0 and wherein the atomic ratio of Ga:(Ga+In) is from 0.1 to 0.5.

3. The method of claim 1, wherein step c.) comprises the step of applying a voltage bias in the range of 25V to 5000V between said counter electrode and said surface to cause the electrophoretic deposition.

4. The method of claim 1, wherein step d.) comprises forming a metal chalcogenide thin film having a thickness of from 100 nanometers to 10 micrometers.

5. The method of claim 1, wherein step d.) further comprises first depositing said chalcogen onto said metal thin film and then heating said thin film to a temperature of from 200 to 700° C. and causing said chalcogen to diffuse into said thin film.

6. The method of claim 1, comprising the further steps of:
   e.) forming a buffer layer adjacent to said metal chalcogenide thin film by a chemical bath deposition;
   f.) forming an insulating layer adjacent to a side of said buffer layer opposite said metal chalcogenide thin film layer by a chemical vapor deposition; and
   g.) forming a transparent conductive contact adjacent to a side of said insulating layer opposite said buffer layer by a chemical vapor deposition.

7. The method of claim 6, wherein step e.) comprises chemical bath deposition of CdS.

8. The method of claim 6, wherein step f.) comprises chemical vapor deposition of a zinc oxide.

9. The method of claim 6, wherein step g.) comprises chemical vapor deposition of an aluminum doped zinc oxide.

* * * * *